United States Patent
Meyer

(10) Patent No.: US 8,641,492 B2
(45) Date of Patent: Feb. 4, 2014

(54) DIRECTIONAL FLOW RAISED FLOOR AIR-GRATE

(76) Inventor: Gary Meyer, Golden, CO (US)

( * ) Notice: Subject to any disclaimer, the term of this patent is extended or adjusted under 35 U.S.C. 154(b) by 529 days.

(21) Appl. No.: 12/930,031

(22) Filed: Dec. 27, 2010

(65) Prior Publication Data

US 2012/0164929 A1    Jun. 28, 2012

(51) Int. Cl.
*H05K 5/00*    (2006.01)

(52) U.S. Cl.
USPC .......................................... 454/184; 52/220.8

(58) Field of Classification Search
USPC ............... 52/263, 220.1, 220.2, 220.8, 126.1, 52/126.2, 126.3, 126.4, 167.7; 454/184
See application file for complete search history.

(56) References Cited

U.S. PATENT DOCUMENTS

| | | | | |
|---|---|---|---|---|
| 1,646,725 A | * | 10/1927 | Davidson | 52/690 |
| 3,511,001 A | * | 5/1970 | Morgan, Jr. | 52/126.5 |
| 3,844,440 A | * | 10/1974 | Hadfield et al. | 220/3.7 |
| 4,258,516 A | * | 3/1981 | Mori et al. | 52/126.6 |
| 4,278,031 A | * | 7/1981 | Dangschat | 108/4 |
| 4,319,520 A | * | 3/1982 | Lanting et al. | 454/290 |
| 4,348,841 A | * | 9/1982 | Ueno et al. | 52/126.5 |
| 4,596,095 A | * | 6/1986 | Chalfant | 52/126.6 |
| 4,598,510 A | * | 7/1986 | Wagner, III | 52/126.6 |
| 4,631,879 A | * | 12/1986 | Kobayashi et al. | 52/98 |
| 4,774,631 A | * | 9/1988 | Okuyama et al. | 361/695 |
| 5,049,700 A | * | 9/1991 | Kobayashi et al. | 174/482 |
| 5,052,156 A | * | 10/1991 | Tanaka et al. | 52/126.6 |
| 5,072,557 A | * | 12/1991 | Naka et al. | 52/126.6 |
| 5,074,085 A | * | 12/1991 | Ueda | 52/126.6 |
| 5,123,776 A | * | 6/1992 | Lang et al. | 404/25 |
| 5,301,480 A | * | 4/1994 | Oyama et al. | 52/126.6 |
| 5,333,423 A | * | 8/1994 | Propst | 52/126.6 |
| 5,389,737 A | * | 2/1995 | Kobayashi et al. | 174/483 |
| 5,398,466 A | * | 3/1995 | Oyama et al. | 52/126.6 |
| 5,459,968 A | * | 10/1995 | Jin | 52/126.6 |
| 5,499,476 A | * | 3/1996 | Adams et al. | 52/220.1 |

(Continued)

OTHER PUBLICATIONS

Sullivan, Robert F., Alternating Cold and Hot Aisles Provides More Reliable Cooling for Seerver Farms. White paper, 2002, The Uptime Institute, Sante Fe, New Mexico.

(Continued)

*Primary Examiner* — William Gilbert
*Assistant Examiner* — James Ference
(74) *Attorney, Agent, or Firm* — Scott L. Terrell, P.C.; Scott L. Terrell

(57) ABSTRACT

A directional flow raised floor air-grate is provided for the enhanced thermal management of a raised floor computer room. The air-grate includes a load bearing frame. The frame has four vertical girders connected, in a ninety-degree alignment, so that four corners of the frame are capable of supporting the air-grate as an air handling separation barrier on a raised floor pedestal support system. A plurality of vertical reinforcing beam members is connected to the frame so that the reinforcing beams are aligned in a longitudinal spaced relationship. At least two vertical airfoil vane members have an upper inclined and, lower vertical planar surfaces. These surfaces are demarcated by a longitudinal axis of the vane members. The vane members are connected to the frame in a crosswise spaced relationship to the reinforcing beam members, so that a plurality of openings are created between the reinforcing beams and the airfoil vanes. The upper inclined planar surface of the airfoil directs cooling air from a lower plenum of a raised floor through the openings on an inclined plane towards the cold air intake surfaces of a data server cabinet to be cooled.

6 Claims, 3 Drawing Sheets

(56) References Cited

U.S. PATENT DOCUMENTS

| | | | |
|---|---|---|---|
| 5,544,012 A * | 8/1996 | Koike | 361/695 |
| 5,628,157 A * | 5/1997 | Chen | 52/263 |
| 5,718,628 A * | 2/1998 | Nakazato et al. | 454/184 |
| 5,758,457 A * | 6/1998 | Achen | 52/198 |
| 5,910,045 A * | 6/1999 | Aoki et al. | 454/186 |
| 6,019,677 A * | 2/2000 | Demster | 454/290 |
| 6,101,768 A * | 8/2000 | Springstead et al. | 52/126.6 |
| 6,186,890 B1 * | 2/2001 | French et al. | 454/184 |
| 6,222,729 B1 * | 4/2001 | Yoshikawa | 361/695 |
| 6,256,952 B1 * | 7/2001 | Fahy et al. | 52/263 |
| 6,264,550 B1 * | 7/2001 | Matsumoto | 454/187 |
| 6,374,627 B1 * | 4/2002 | Schumacher et al. | 62/259.2 |
| 6,519,902 B1 * | 2/2003 | Scissom | 52/126.4 |
| 6,550,195 B1 * | 4/2003 | Cooper et al. | 52/220.3 |
| 6,557,357 B2 * | 5/2003 | Spinazzola et al. | 62/89 |
| 6,672,022 B2 * | 1/2004 | Simmons | 52/263 |
| 6,672,955 B2 * | 1/2004 | Charron | 454/184 |
| 6,745,579 B2 * | 6/2004 | Spinazzola et al. | 62/89 |
| 6,747,872 B1 * | 6/2004 | Patel et al. | 361/695 |
| 6,832,951 B2 * | 12/2004 | Orendorff | 454/290 |
| 6,857,230 B2 * | 2/2005 | Owen | 52/126.6 |
| 6,862,179 B2 * | 3/2005 | Beitelmal et al. | 361/679.53 |
| 7,140,156 B1 * | 11/2006 | Lowe et al. | 52/263 |
| 7,232,369 B2 * | 6/2007 | Karidis et al. | 454/274 |
| 7,315,448 B1 * | 1/2008 | Bash et al. | 361/701 |
| 7,347,058 B2 * | 3/2008 | Malone et al. | 62/259.2 |
| D567,398 S * | 4/2008 | Meyer | D25/156 |
| 7,360,343 B1 * | 4/2008 | Spransy et al. | 52/263 |
| D588,716 S * | 3/2009 | Meyer | D25/142 |
| 7,546,715 B2 * | 6/2009 | Roen | 52/506.05 |
| 7,568,360 B1 * | 8/2009 | Bash et al. | 62/186 |
| 7,644,550 B2 * | 1/2010 | Meyer | 52/263 |
| 7,779,587 B1 * | 8/2010 | Meyer | 52/263 |
| 7,823,340 B2 * | 11/2010 | DeJonge et al. | 52/126.2 |
| 7,991,592 B2 * | 8/2011 | VanGilder et al. | 703/1 |
| 8,056,300 B2 * | 11/2011 | Meyer | 52/745.06 |
| 8,091,302 B2 * | 1/2012 | Meyer | 52/263 |
| 8,099,912 B2 * | 1/2012 | DeJonge et al. | 52/126.2 |
| 2002/0059804 A1 * | 5/2002 | Spinazzola et al. | 62/259.2 |
| 2002/0078638 A1 * | 6/2002 | Huang | 52/126.6 |
| 2004/0065104 A1 * | 4/2004 | Bash et al. | 62/259.2 |
| 2004/0075984 A1 * | 4/2004 | Bash et al. | 361/695 |
| 2006/0214014 A1 * | 9/2006 | Bash et al. | 236/1 B |
| 2007/0125107 A1 * | 6/2007 | Beam | 62/186 |
| 2008/0174954 A1 * | 7/2008 | VanGilder et al. | 361/687 |
| 2008/0274685 A1 * | 11/2008 | DeJonge et al. | 454/241 |
| 2009/0056910 A1 * | 3/2009 | Mallia et al. | 165/80.3 |
| 2009/0059523 A1 * | 3/2009 | Mallia et al. | 361/695 |
| 2009/0129015 A1 * | 5/2009 | Nobile | 361/692 |
| 2009/0151271 A1 * | 6/2009 | Meyer | 52/126.6 |
| 2009/0156114 A1 * | 6/2009 | Ahladas et al. | 454/184 |
| 2009/0320393 A1 * | 12/2009 | Meyer et al. | 52/223.6 |
| 2010/0141105 A1 * | 6/2010 | Slessman | 312/236 |
| 2010/0180520 A1 * | 7/2010 | Meyer | 52/126.6 |
| 2010/0180539 A1 * | 7/2010 | Meyer | 52/745.05 |
| 2010/0281789 A1 * | 11/2010 | Vac | 52/126.5 |
| 2010/0304657 A1 * | 12/2010 | Gallmann et al. | 454/184 |
| 2010/0317278 A1 * | 12/2010 | Novick | 454/184 |
| 2011/0014862 A1 * | 1/2011 | Honold et al. | 454/184 |
| 2011/0041423 A1 * | 2/2011 | DeJonge et al. | 52/126.6 |
| 2011/0059687 A1 * | 3/2011 | Katsui et al. | 454/275 |
| 2011/0122570 A1 * | 5/2011 | Beck et al. | 361/679.46 |
| 2012/0009862 A1 * | 1/2012 | Meyer | 454/184 |

OTHER PUBLICATIONS

Meyer, Gary, Passive Energy Efficient Cooling, Triad Floors Web catalog. 2006. Triadfloors.com. Denver, Colorado.

* cited by examiner

US 8,641,492 B2

DIRECTIONAL FLOW RAISED FLOOR AIR-GRATE

CROSS REFERENCE TO RELATED APPLICATIONS

None.

STATEMENT OF FEDERALLY SPONSORED RESEARCH

Not Applicable.

BACKGROUND OF THE INVENTION

1. Field of the Invention

The present invention relates to raised floor air-grate panels. In particular, it relates to an improved directional flow raised floor air-grate panel, and system for the improved thermal management of computer rooms.

2. Description of the Related Art

Raised floors are used in data centers to create a space between a sub-floor of the building and the normal working environment of the computer room. The space between the sub-floor and the raised floor panels creates an under floor cool-air circulating plenum for thermal management of the data processing servers installed in rack systems on top of the raised floor. The floor panels, themselves, are either solid or perforated. Of the perforated panels, manufacturers have made new design changes in an effort to increase the available open area of the panels, in order to increase the air flow of cooling air throughout the room. These efforts have led to the production and use of air-grate raised floor panels. The air-grate panels use an open frame design so that cooling air, originating in the under floor, or lower, plenum flows upwardly through the openings in the air-grate frame and into the computer room in order to aid in cooling the server cabinets installed on top of the raised floor. The air-grate panels may also include perforated top plates, connected to the air-grate structural frame members, in order to provide a variety of different working surfaces having a desired aesthetic appearance, or with the perforations, or openings, in the plate configured so as comply with certain federal and state regulations, as they relate to occupational safety and/or persons with disabilities, or to increase air flow and cooling efficiency.

Overall, the cooling components, of a computer room, are charged with creating, and moving air on the data center floor. From there, the room itself must maintain separate climates in relation to the cool air, which is required by the servers, and the hot air which they exhaust. Without separate boundaries, the air paths mix, resulting in both economic and ecological consequences. Air-grate panels are thus a key cooling component in the overall design and construction of computer rooms. With a raised floor, the use of air-grate panels is a way to separate the computer room into a "lower-plenum/upper-plenum" air handling boundary configuration where the cooling air "originates" in the lower plenum, flows upwardly through the openings in the air-grate panels, and is made available for cooling the server cabinets, installed on the raised floor, in the upper plenum of the computer room. In operation, the data processors heat the air, in the upper plenum, where it is returned to the computer room air conditioning units ("CRAC") for cooling, and recycling the conditioned air back into the lower, or under-floor, plenum.

A further refinement, in the use of air-grate floor panels, came in the early 2000s, when scientists advanced the concept of "hot aisle/cold aisle", as an additional means for attempting to achieve air separation within the server room. This design, which aligns data center cabinets into alternating rows, endures in critical facilities throughout the world, and is widely regarded as the first major step in improving airflow management. In use, part of this air flow, or stream, enters the racks and then the equipment, and part of the air flow bypasses the equipment and returns to the air handling units. The air that enters the servers is heated, and then exhausted through the back of the servers where it is recycled as return air into the air handling units. Typically, some intermixing of the hot and cold air paths is experienced due to improper sealing in the rack, or recirculation above and around the sides of the rack rows.

Other conditions occur which interfere with optimum cooling efficiency, as well. For example, "bypass air" is an interfering condition observed when conditioned air that does not reach computer equipment escapes through cable cut-outs, holes under cabinets, or misplaced perforated tiles or holes in the computer room perimeter walls. Bypass air limits the precise delivery of cold air at the server intake. "Hot air recirculation" is also an interfering condition found under conditions where waste heat enters the cold aisle. In order to combat this condition, operators ensure that the cooling infrastructure must throw colder air at the equipment to offset mixing. Another such condition is hot air contamination which prohibits the air handlers from receiving the warmest possible exhaust air, rendering their operation less efficient. Finally, hot spots may persist as a result of any, or all, of the above conditions.

Concomitant with the ever increasing advancements in the volume and speed within which data is processed; data center operators are observing a rise in the energy of the thermal dissipation for the data processor equipment installed in upper plenum of the center. Indeed, the thermal dissipation energy, resulting with the use of such technologies, is now exceeding the operational design limitations, for even the most popular designs of air-grate floor panels in use today, in even those computer rooms which employ the lower-plenum/upper-plenum and hot aisle/cold aisle air separation boundary layer technologies. These uses generate enormous heat loads, on the system, for dissipation, within the same volumetric area, which significantly increases the concentration of heat applied to the internal data processing conductors in the server. For example, it is not uncommon to now experience server racks pushing 7 kw per rack, with operational expectations within the industry of scaling upwards to a 12-30 kw use. Thus, certain manufacturers of air-grate floor panels are experimenting with designs which further increase the available open area of the openings in the air-grate or perforations in the panel top plate. In addition, operators are also working on ways to lower the temperature set-point of the entire data center in order to enhance cooling of those computer servers which are positioned in the upper reaches of the server racks, in the upper plenum. However, the first design solution includes inherent structural load and safety limitations, and the second operational solution significantly drives up the cost in providing electrical utilities to the center.

Another structural solution is directed toward an effort in continuing to redesign the air flow characteristics of the air-grate panels themselves, with an appreciation in both the air flow separation dynamics, when passing through the flat bottom of the slotted air-grate, and also as to air flow passing through the air-grate when installed on a pedestal support system. One such design is illustrated in U.S. patent Ser. No. D567,398, to Meyer. There, it is ordinarily observed that air scoops are projecting downwardly as part of the superstructure of the air-grate frame. It is readily apparent that the scoop design would act to capture air, as it flows in a generally horizontal direction through the lower plenum of a raised floor. A fluid dynamic, inherent in such design, would result in an increase in the velocity of the air flowing from the lower plenum, as it curves upwardly when passing the scoop, and into the upper plenum, of a computer room, through slotted perforations in the air-grate floor panel plate. This increase in velocity would seem to enhance cooling and further promote the creation of air separation barriers within the computer room.

While the foregoing methods and materials are useful in providing thermal separation of the hot and cooling environments in a raised floor data center, there still exists a need to provide an improved air-grate floor panel and system which enhances cold aisle containment by generally ensuring that the cold air stays at the server intake, while the air handlers receive the warmer exhaust air, improving their efficiency. Moreover, there is a need for an improved structural design in the manufacture air-grate raised floor components which enhances the capture of warm exhaust air, via computer room air conditioners, conditions it, and returns it via the lower plenum through the cold aisle. Finally, there is a need to provide an improved air-grate structural design and system which effectively breaks the boundary layer of heat, in front of the computer server cabinets, and reduces the amount of bypass air, hot air recirculation, and hot air contamination, all of which would result in a reduction in the number of hot spots. The present invention satisfies these needs.

BRIEF SUMMARY OF THE INVENTION

It is therefore an object of the present invention to provide a directional flow air-grate floor panel for use directing an airflow from the lower plenum of a raised floor at an inclined plane toward the frontal surface of a data server cabinet installed on the raised floor upper plenum of a computer room.

It is another object of the present invention to provide a system for directing cooling air at an inclined plane toward the air intake frontal surface of a data server cabinet in order to effectively break the boundary layer of heat, in front of the computer server cabinets, and reduce the amount of bypass air, hot air recirculation, and hot air contamination, in order to reduce the number of hot spots in a computer server room.

To overcome problems associated with the prior art, and in accordance with the purpose(s) of the present invention, briefly, a directional flow raised floor air-grate is provided for the enhanced thermal management of a raised floor computer room. The air-grate includes a load bearing frame. The air-grate includes a load bearing frame with four vertical girders connected, in a ninety-degree alignment, so that four corners of the frame are capable of supporting the air-grate as an air handling separation barrier on a raised floor pedestal support system. A plurality of vertical reinforcing beam members is connected to the frame so that the beam members are aligned in a longitudinal spaced relationship. At least two vertical airfoil vane members have an upper inclined surface and a lower vertical planar surface. These surfaces are demarcated along a longitudinal axis of the vane members. The vane members are connected to the frame in a crosswise spaced relationship to the reinforcing beam members so that a plurality of openings are created between the reinforcing beams and the airfoil vanes. The upper inclined planar surface of the airfoil directs cooling air from a lower plenum of a raised floor through the openings on an inclined plane towards the cold air intake surfaces of a data server cabinet, to be cooled.

Additional advantages of the present invention will be set forth in the description that follows, and in part will be obvious from that description or can be learned or appreciated from practice of the invention. Moreover, the advantages of the invention can be realized and obtained by the invention as more particularly pointed out in the appended claims.

BRIEF DESCRIPTION OF THE SEVERAL VIEWS OF THE DRAWINGS

The accompanying drawings, which are incorporated in and which constitute a part of the specification, illustrate at least one embodiment of the invention and, together with the description, explain the principles of the invention through illustration to persons of skill in the art.

DETAILED DESCRIPTION OF THE DRAWINGS

Figure 1:
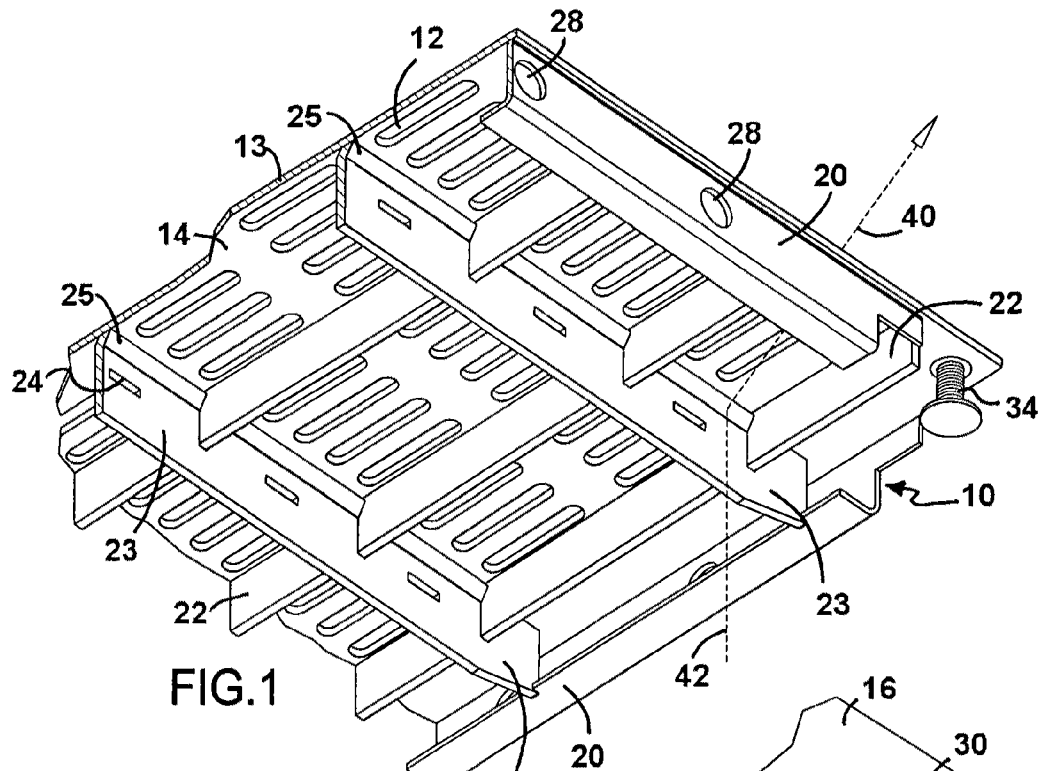
FIG. 1 is an isometric view of the directional flow air-grate, in accordance with the present invention, showing the preferred embodiment where the air-grate includes the top plate, as a working surface, together with the leveling screws threaded into each of the corners of the top plate.

Unless specifically defined otherwise, all scientific and technical terms, used herein, have the same ordinary meaning as would be commonly understood by one of ordinary skill in the art to which this invention belongs. In practice, the present invention improves "cold aisle containment" by generally ensuring that the cold air stays at the server intake, while the computer room air conditioning units, or air handlers, receive the warmer exhaust air, improving their efficiency. Moreover, the invention enhances the "capture of exhaust air" via in-row air conditioners which condition it and returns it via the lower plenum and directional air-grate cold aisle formed with the present invention. Air conditioning efficiency is further improved as neither the hot exhaust air nor cold inlet air has far to travel. The term "lower plenum" means that portion of the computer room below the air-grate floor panels when installed on a pedestal support system. The term "upper plenum" means that portion of the computer room above the air-grate floor panels, including the data processing server equipment and in-row air conditioners, or air handling units. Thus, the term "computer room" means the overall air handling environment including the upper and lower plenums from the subfloor to ceiling. Finally, "CRAC units" means those computer room air conditioning units typically located at the perimeter of the data center floor surrounding the (server) racks, or in-rows, to circulate air in the data center space to create a cooling loop.

Although any methods and materials similar or equivalent to those described herein, can be used in the practice or testing of the present invention, the preferred methods and materials are now described. Reference will now be made in detail, to the presently preferred embodiments of the invention, including the examples of which are illustrated in the accompanying drawings. In the drawings, like numerals will be used in order to represent like features of the present invention.

The present invention provides a directional flow raised floor air-grate for the enhanced thermal management of a raised floor computer room. As shown in the drawing figures, and conjunction with the presently preferred embodiment of the present invention, the air-grate may, but need not, include, a perforated floor panel top plate 13, having upper 16 and lower 14 surfaces. However, the present invention is specifically contemplated for use without the top plate 13. Thus, in the drawing figures, the air-grate of the present invention is only illustrated in the presently preferred embodiment which includes the perforated top plate 13, with slots, for the purpose of illustrating the best mode of the presently preferred embodiment, and not by way of limitation.

Thus, overall the air-grate 10 is a load bearing frame. The frame includes a four vertical girders 20 connected in a ninety-degree alignment, to one another, so that four corners of the frame are capable of supporting the air-grate 10 as an air handling separation barrier on a raised floor pedestal support system. A series of vertical reinforcing rib members 22 are connected to the frame in a longitudinal spaced relationship. At least two vertical airfoil vane members include an upper inclined surface 25 and a lower vertical planar surface 23. The surfaces 23, 25 are desirably formed from a blank steel stock with a bend along the longitudinal axis of the stock which demarcates the vertical 23 and inclined 25 surfaces. The demarcation results in a curvature which gives the vane its shape as an airfoil. The airfoil has all of the physical and air flow dynamic attributes of a wing, or fin, when subjected to a passing current of air. The airfoil vanes are connected to the girders 20, in the frame 10, in an alignment which is crosswise to the reinforcing beam members 22. This alignment results in a series of generally square or rectangular voids with in the framework which serves as the openings for ducting the lower plenum airflow past the airfoil surfaces 23 and 25. The openings are sufficient is size and shaped so that the upper inclined planar 25 surface, or the airfoil, is capable of directing cooling air 42, originating in the lower plenum and traveling in a generally horizontal direction, through the openings and then upwardly, on an inclined plane, so that the cooling air flow 40 is directed to impact the cold air intake surface 52, of a data server cabinet 50, to be cooled.

By including the top plate 13, the directional flow air-grate 10 is also useful in combination with, or retrofit to, any raised access floor pedestal support system which is well known in the art. The air-grate 10 and top plate 13 are preferably fabricated of steel which is cut, welded, drilled, die-cast, and/or pressed in to subassemblies, or completed panels, in the shop for final finishing, such as powder coating, warehousing, order, and rapid shipment. The top plate 13 includes a plurality of openings which may be circular, but are desirably slotted with a long axis extending in the direction which impacts the frontal plane of the server cabinets to be cooled, and perpendicular in alignment to the long axis of the airfoil vanes. As shown in the drawing figures, the floor panel plate 13 is supported one the air-grate 10 frame 20, and is connected to the lower surface 14, of the top plate 13 so that the four corners defined by girders 20 act to support the plate 13 on the pedestal head 66 members, of the raised floor support system.

The air-grate 10 includes at least two vertical airfoil vane members which have vertical 23 and inclined 25 surfaces connected to the support frame 20. The airfoils are arranged in a horizontally spaced relationship to one another, and in a crosswise spaced relationship to the reinforcing beams 22. In this configuration the openings operate in a like manner as would an air flow duct in creating a void for directing the cooling air 42 upwardly through the slots 12 in the floor panel plate 13. The inclined planar surfaces 25 are positioned adjacent to the lower surface 14 of the floor panel 10 so that the surfaces 25 direct cooling air 42 from the lower plenum, of the raised floor, through the long axis of the slots 12 on an inclined plane which impacts the cold air intake surfaces 52 of a data server cabinets 50, to be cooled.

The vane members include an upper edge and a lower edge. The upper and lower edges define a chord length. In the presently preferred embodiment, the inclined surface 25 extends downwardly from the upper edge to a predetermined point, along the airfoil, which is less than the chord length. For example, but without limitation, the inclined surface 25 extends downwardly to a distance which is between one-half to one-third of the chord length. The longitudinal axis of the airfoil vane is desirably aligned, for connections within the support frame, perpendicular to the long axis of the slots 12. This configuration greatly enhances the rate and direction of the airflow 40 at an incline to the frontal intake 52 of the server cabinets 50. As one may readily appreciate, by horizontally rotating the floor panel 10, in either a ninety or one-hundred-eighty-degree direction, on the pedestal support stringers 70, one can easily cause the air flow 40 to be re-directed in a desired direction for optimum cooling efficiency. Again, this feature is also useful in retrofit applications, or when replacing floor panels from one room to another.

It is even more desirably to cut or drill a series of longitudinally spaced clear holes, or slots 24, along the long axis of the airfoil vertical vane surface 23 in order to enhance an even distribution the cooling air flow 42 throughout the cold aisle 56. It is even more desirable to include a series of longitudinal spaced clear holes 28, in the girders 20 so that the cooling air 42 circulates freely between the air-grates 10, when they are installed in a row, or multiples of adjacent rows. In this manner, the clear holes 28 operate in reducing short cycle of the air-grate 10 within the operable design of the cold aisle 56.

One problem, which routinely exists when looking for suitable air-grate panels for use as replacement panels to an original equipment manufacture floor system, is that the floor panels must be of an exacting vertical thickness dimension to that the working surfaces fit in a horizontal planar alignment with the other elements of a raised floor. This problem often requires one to seek out a manufacture of individual panels, on a per-piece custom order basis, with the exacting dimensions. Obviously, this approach delays installation time and drives up the costs often associated with an entire shut-down of the entire computer room. However, the directional air-grate 10, in accordance with the present invention, is easily adapted for use with a wide variety of original equipment under-floor supporting structures. With that purpose in mind, the air-grate floor panel plate 13 includes a clear hole 30, positioned adjacent to each corner of the floor panel plate 13, for access to a the panel leveler 34 from the upper surface 16, of the panel plate 13. The leveler 34 includes components which preferably, but need not, include an internally threaded collar 32, which is vertically connected, preferably by welding, to the underside 14 of the floor panel plate 13 in axial alignment with the clear holes 30. The panel leveler 34 operates as a set screw, having an upper tool receiving end, and a lower foot end 36. The foot end 36 is used to bias against the pedestal head 66. By turning the set screw 34, from the tool receiving end 30, the installer easily positions the upper surface 16, of the plate 13, to a predetermined level in relation to a pedestal support head 66 so that the floor panel plate 13, is perfectly aligned with the horizontal plane previously established by the raised floor. This feature, when used in combination with the air-grate 10 and plate 13, is particularly useful in eliminating trip hazards without the need to remove the panels and to make adjustments to the pedestal supports, themselves.

Figure 3:
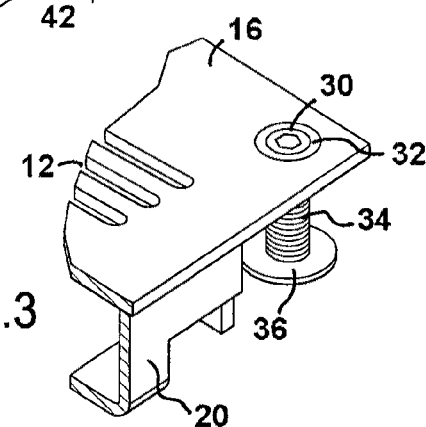
FIG. 3 is side sectional view showing the air foil vanes directing a cooling airflow in a direction which is inclined plane to the frontal air intake surface of the data processing server racks installed in the upper plenum of the computer room.
Figure 2:
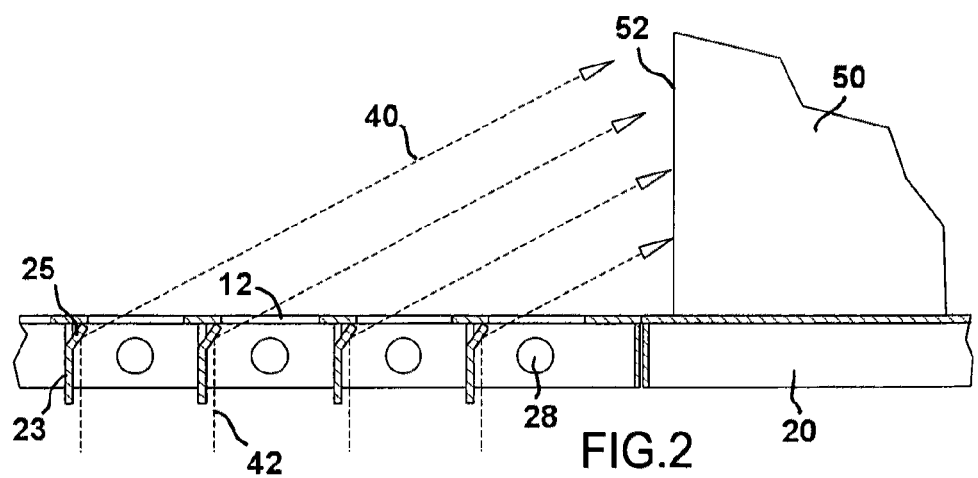
FIG. 2 is an isometric view, showing an enlarged and inverted corner portion, of the air-grate and horizontal plate, as illustrated in FIG. 1.
Figure 4:
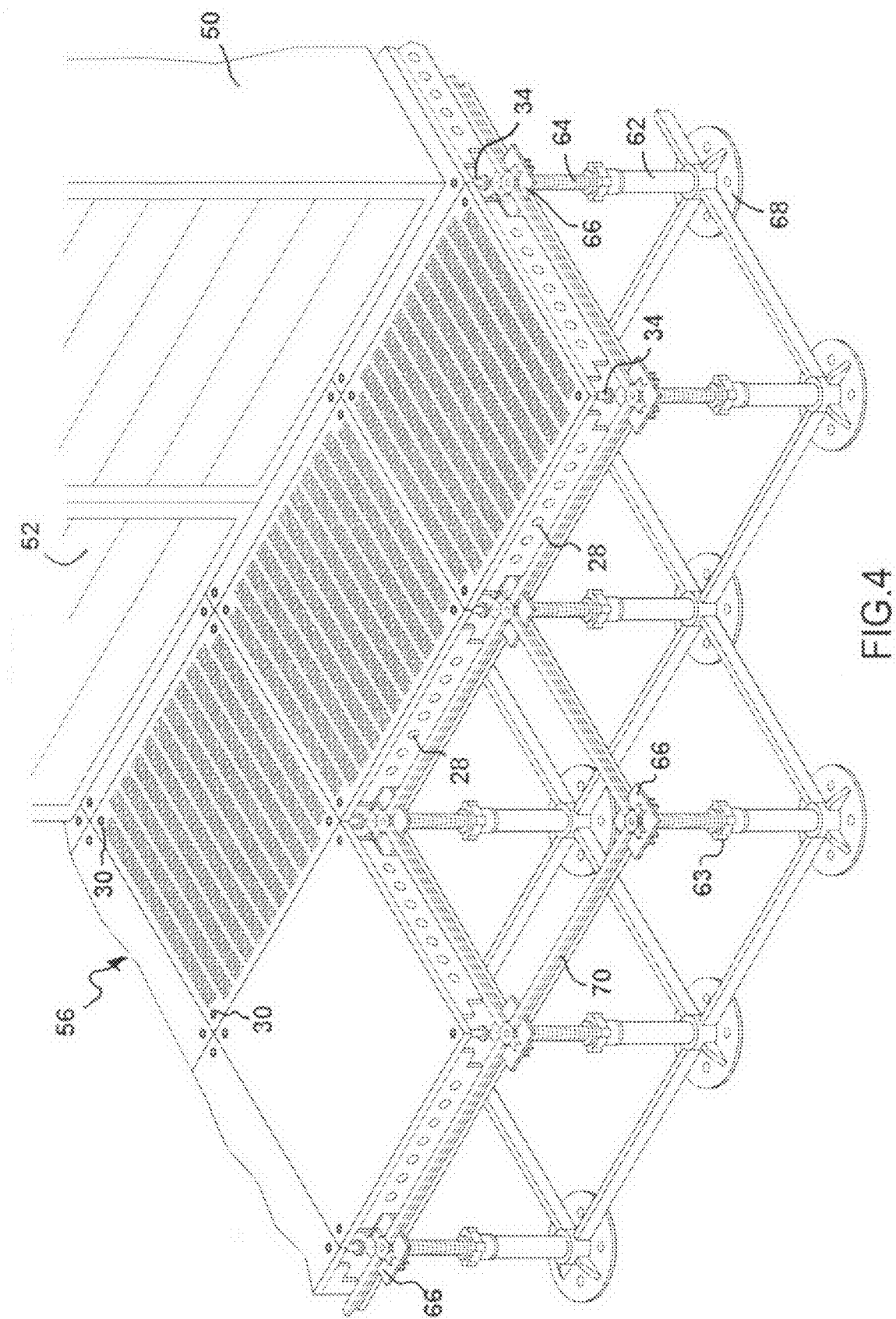
FIG. 4 is an isometric view of the air-grate as a component in the system, or the present invention, where the air-grates are supported on a pedestal support system, in a row which forms the cold aisle of the computer room in order to directs cooling air from the lower plenum of the room at a plane which is inclined to the frontal surface of the air intake of the server racks.
Figure 5:
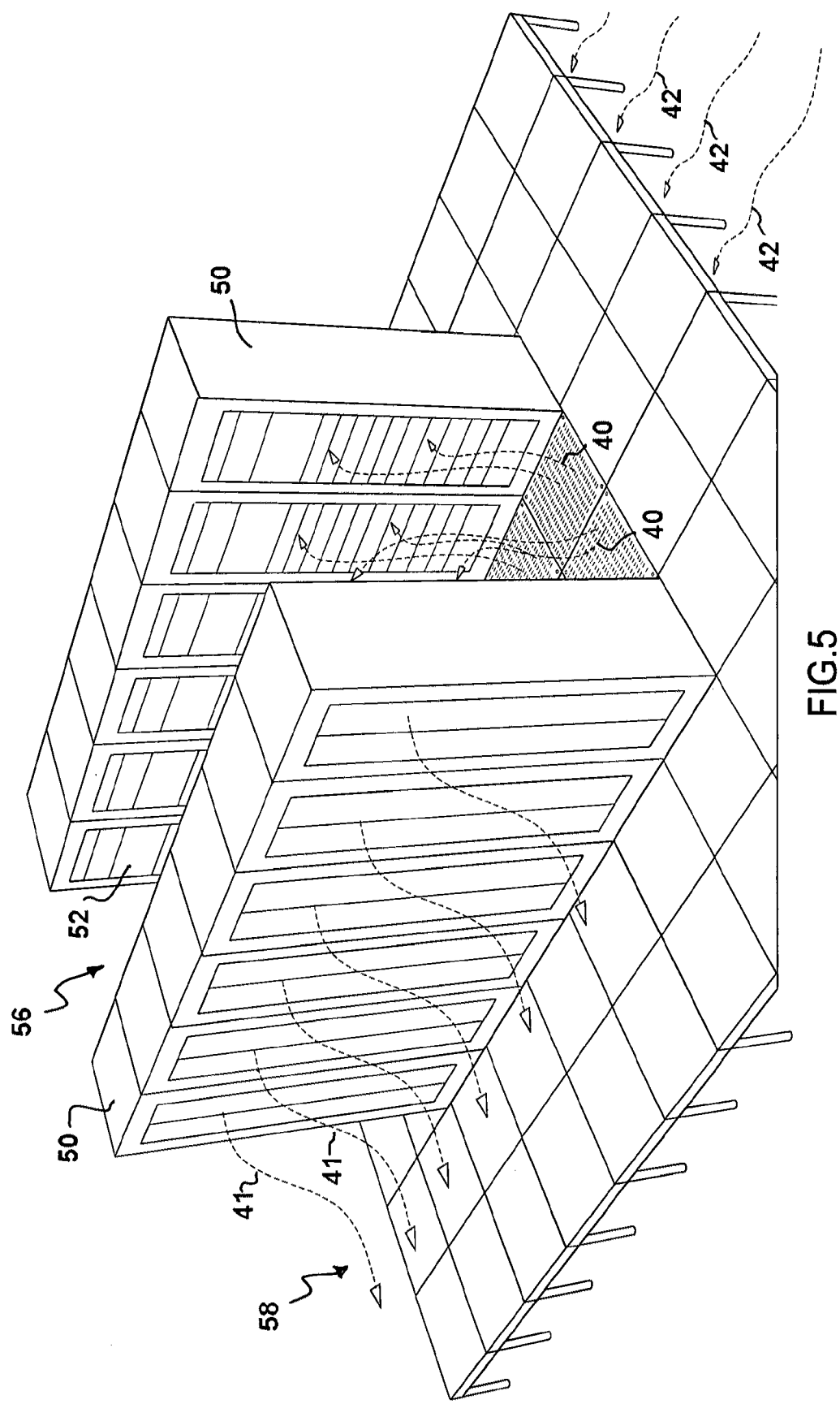
FIG. 5 is an isometric view of the system, according to the present invention, which shows the preferred air flow separation barriers for use in the improved thermal management of the computer room.

Turning now to FIGS. 3 and 4, in use, the directional air flow air-grate 10 is a key component part in the overall design of a system for directing cooling air 40 at an incline toward the frontal air intake surface 52 of a data server cabinets 50. This system is based for use on any a pedestal support system which is well known in the art. Such systems typically include a plurality of vertically extending adjustable pedestal support members. The pedestal support members each having an upper externally threaded rod 64, connected to a pedestal support head 66, and a lower internally threaded tube 62, connected to a pedestal support base 68. Once adjusted to the desired vertical height, the threaded tube 62 and rod 64 are fixed in their relative positions with a lock nut 63. The pedestal support bases 68 are connected to the subfloor of a raised floor data center building construction. The pedestal supports are each connected in a square, or rectangular, matrix orientation with a plurality of horizontal stringers 70. The matrix is configured in a predetermined dimension which is consistent with the dimension of the air-grates 10, to be installed on pedestal support heads 66. In this manner, it may, but need not, be constructed to accommodate floor panels 10 having a rectangular dimension (not shown), as opposed to square, a determination which may be dictated by the amount of required space between server racks, according to any particular application of use, or by state or federal regulation.

The air-grates 10 are mounted in a course, or row, on the pedestal heads 66 and stringers 70 so that a cold aisle 56 is formed in front of a row of data processing server equipment 50. As above, the directional air flow air-grates 10 desirably have a perforated top plate 13 which includes the clear slots 12. The air-grate frame 20, is connected to the lower surface 14 of the top plate 13, has the four girders 20 which are the main support for the plate 13. The girders 20 preferably have a lower flange for additional structural strength, and to facilitate alignment and support of the girders 20 in the stringers 70. The vertical airfoil vane members are connected to the support frame. As above, the airfoil vane members include the upper inclined planar surface 25, extending along a longitudinal axis of the vane, which acts to direct a pressurized cooling air from the lower, or under floor, plenum, of the raised floor, through the slots 12, in plate 13, on a plane which is inclined to the cold air intake plane of a data server cabinet 50 to be cooled.

It is inherent in the construction of a raised floor that in includes a lower air plenum which advantageously creates a void between the subfloor, of a raised floor data center, and the lower surface of the air-grate 10 for separation of the air delivery and handling in the room. The CRAC units (not shown) are used to remove and return heated air 41, separated in the upper plenum, cool that air, and pressurize the lower plenum with a predetermined volume of the cooling air 42. The inclined surface 25 of the airfoil then acts to direct the pressurized cooling air 42, in the lower plenum, through the openings in the air-grate, or slots 12 in the panel plate 13, when used, on an inclined plane toward the cold air intake surface 52 of a data server cabinet 50, to be cooled. It is preferred that the airfoils are connected so that their longitudinal axis is in perpendicular alignment to the long axis of the slots 12, that the support frame further include a series of vertical reinforcing beams 22 extending in parallel alignment to the long axis, that the air foil vane vertical surfaces 23 have a series of longitudinally spaced clear holes, or slots 24, that the plate 13 include the panel leveler 34 components.

By way of example, and not by limitation, heated return air (27° C.) 41, is generated during the operation of the data servers 50 when it is exhausted through the servers 50 and into the hot aisles 58 area behind the servers. The heated 41, or return air, flows into the CRAC units which are located in the computer room on top of the raised floor. In this example, the return air 41 is conditioned to 18° C., by the CRAC units, and is ducted downwardly into the lower, or under-floor, plenum where it acts to pressurize the lower plenum, causing a positive pressure differential, in relation to the upper plenum portion of the computer room, above the raised floor. This pressure differential causes the conditioned air 42 to be forced through the lower plenum, upwards past the airfoil vane vertical 23 and inclined 25 surfaces, where it is deflected at an angle, and through the long axis of the slots 12 in a direction which impacts the frontal surface 52 of the data server equipment 50 contained on the server racks. Impact and stratification dynamics, inherent in the use of the novel system disclosed herein, act to cause the cooling air 40 to flow in a direction which continually passes the frontal intake portions 52 of the server cabinets 50. As this air 40 passes the front 52 of the server cabinets 50, the server fans operate to evacuate the conditioned air 40 through the server cabinet 50 where it is heated 41 and exhausted (32° C.) out of the back of the server cabinets, and into the hot aisle 58. The hot air exhaust 41 then becomes the make-up return air for recycle through the system.

While, the present invention has been described in connection with the preferred and illustrated embodiments, it will be appreciated and is understood that certain modifications may be made to the present invention without departing from the true spirit and scope of the invention.

I claim:

1. A directional flow raised floor air-grate for the enhanced thermal management of airflow in a data center, comprising:
    (a) a top plate having a plurality of clear shots, an upper working surface, a lower surface, and four corners;
    (b) a load bearing frame connected to said lower surface of said top plate, said load bearing frame comprising four vertical girder members, and a plurality of vertical reinforcing beam members, wherein said girder members are connected to said top plate in a ninety-degree alignment so that said girder members are capable of supporting said top plate as an air handling separation barrier, between a cold air flow in a lower plenum and a warm air flow in an upper plenum, on a raised floor pedestal support system, and said plurality of vertical reinforcing beam members are connected to said girder members in a longitudinal spaced relationship;
    (c) at least two vertical airfoil vane members, each of said airfoil vane members having an upper edge, a lower edge, and a bend formation positioned along a longitudinal axis thereof, said bend formation defining an upper inclined surface, and a lower vertical surface, said upper inclined surface having an upper edge positioned adjacent to said lower surface of said top plate, and said lower vertical planar surfaces having a lower margin adapted to extend deeper into said lower plenum than said reinforcing beam members to transversely interrupt a direction of said cold air flow in said lower plenum, and whereby said vane members are connected to said load bearing frame in a crosswise spaced relationship to said reinforcing beam members; and (d) a plurality of open, but not dampened, airflow channels established between wither of said girder and reinforcing beams members of said framework, and said airfoil vane members, said channels capable of tunneling a flow of said transversely interrupted airflow of said cold air from said lower plenum, and ducting said interrupted airflow past said upper inclined surface of said airfoil van members, and through said slots in said top plate on an inclined plane.

2. The directional flow raised floor air-grate according to claim 1, wherein said upper edge and said lower edge of said airfoil vanes define a cord length and of said bend formation along said longitudinal axis extends downwardly from the upper edge of said airfoil vane members to a predetermined point along the airfoil vane members which is less than one-half of said chord length.

3. The directional flow raised floor air-grate according to claim 1, wherein said airfoil vane members further comprise a first plurality of clear holes positioned in a longitudinally spaced relationship through said lower vertical surface of said airfoil vane members.

4. The directional flow raised floor air-grate according to claim 2, wherein said vertical girder members further comprise a second plurality clear holes positioned in a longitudinally spaced relationship through said girder members.

5. The directional flow raised floor air-grate according to claim 2, further comprising a panel leveler assembly positioned adjacent to each of said corners of said top plates, said leveler assembly including a threaded collar vertically connected to said lower surface of said floor panel top plate, and a set screw having a lower foot end, said set screw threadably engaging said threaded collar to adjustably position said upper working surface of said top plate to a predetermined level in relation to a pedestal support head member.

6. The directional flow raised floor air-grate according to claim 2, wherein a long axis of said plurality of clear slots in said top plate extends directionally perpendicular to said vane members.

* * * * *